United States Patent
Chen et al.

(10) Patent No.: US 7,165,232 B2
(45) Date of Patent: Jan. 16, 2007

(54) I/O CIRCUIT PLACEMENT METHOD AND SEMICONDUCTOR DEVICE

(75) Inventors: Wang-Jin Chen, Kaoshiong (TW); Chen-Teng Fan, Hsinchu (TW); Cheng-I Huang, Hsinchu (TW); Ya-Yun Liu, Hsinchu (TW)

(73) Assignee: Faraday Technology Corp., Hsin-Chu (TW)

( * ) Notice: Subject to any disclaimer, the term of this patent is extended or adjusted under 35 U.S.C. 154(b) by 334 days.

(21) Appl. No.: 10/733,095

(22) Filed: Dec. 11, 2003

(65) Prior Publication Data

US 2005/0127405 A1 Jun. 16, 2005

(51) Int. Cl.
*G06F 17/50* (2006.01)
*H01L 29/40* (2006.01)

(52) U.S. Cl. .................. 716/8; 716/7; 716/10; 716/11; 257/786

(58) Field of Classification Search .................. 716/7, 716/8, 4, 10; 257/786, 778, 203; 438/14, 438/128
See application file for complete search history.

(56) References Cited

U.S. PATENT DOCUMENTS

| | | | | |
|---|---|---|---|---|
| 4,377,849 A | * | 3/1983 | Finger et al. ................. 716/7 |
| 5,885,855 A | * | 3/1999 | Liang ......................... 438/128 |
| 6,037,669 A | | 3/2000 | Shu et al. .................... 257/786 |
| 6,057,169 A | * | 5/2000 | Singh et al. .................. 438/14 |
| 6,269,327 B1 | * | 7/2001 | Bednar et al. ................. 703/8 |
| 6,489,688 B1 | | 12/2002 | Baumann et al. ........... 257/786 |
| 6,721,933 B1 | * | 4/2004 | Iwasa ........................... 716/10 |
| 6,727,596 B1 | * | 4/2004 | Takabayashi et al. ....... 257/786 |
| 6,836,026 B1 | * | 12/2004 | Ali et al. ..................... 257/786 |
| 6,880,143 B1 | * | 4/2005 | Yu ................................ 716/8 |
| 2002/0056857 A1 | | 5/2002 | Iwasa ......................... 257/203 |

* cited by examiner

*Primary Examiner*—Jack Chiang
*Assistant Examiner*—Helen Rossoshek
(74) *Attorney, Agent, or Firm*—Winston Hsu

(57) ABSTRACT

An I/O circuit placement method. In the I/O circuit placement method, at least two rows of I/O circuits are placed on a first side of the chip, and each I/O circuit has a head section and a tail section. The placement direction of the head section and the tail section is perpendicular to the placement direction of the I/O circuits in the rows. The semiconductor further has a core circuit disposed on the chip, wherein the rows of I/O circuits are disposed outside the core circuit and are at the periphery of the chip. Due to the I/O circuit placement in the semiconductor device, the present invention reduces the area of the semiconductor chip and fabrication cost.

8 Claims, 2 Drawing Sheets

I/O CIRCUIT PLACEMENT METHOD AND SEMICONDUCTOR DEVICE

BACKGROUND OF THE INVENTION

1. Field of the Invention

The present invention relates to an I/O circuit placement method and semiconductor device using the same.

2. Description of the Related Art

FIG. 1 shows a conventional semiconductor chip having application specific integrated circuits (ASIC). Input/Output buffer circuits 12 (hereinafter referred as I/O circuits) are arranged at the periphery of the chip 10. As shown in FIG. 1, each side of the semiconductor chip 10 has one row of I/O circuits, and the four rows of I/O circuits form a loop.

Conventionally, the I/O circuits in a semiconductor chip are always arranged in one loop around the core circuit 14. Thus, a large number of I/O circuits 12 at the periphery of the chip may enlarge the area of the semiconductor chip 10, and is referred to as the pad limit design. To address this problem, conventional methods have attempted with difficulty to narrow the size of the I/O circuits.

SUMMARY OF THE INVENTION

It is therefore an object of the present invention to reduce the space wasted in the pad limit design, thereby reducing costs.

According to the above mentioned objects, the present invention provides an I/O circuit placement method for placing I/O circuits in a semiconductor device. In the method, at least two rows of I/O circuits are placed on a first side of a chip, and each I/O circuit has a head section and a tail section. The placement direction of the head section and the tail section is perpendicular to that of the I/O circuits in the rows. Further, in the method, the head sections can be oriented to the head sections or tail sections in the adjacent rows. Additionally, different numbers of I/O circuits can be placed in different rows.

According to the above mentioned objects, the present invention provides a semiconductor device. In the semiconductor device, at least two rows of I/O circuits are placed on a first side of the chip, and each I/O circuit has a head section and a tail section. The placement direction of the head and tail sections is perpendicular to the placement direction of I/O circuits in the rows. The semiconductor further has a core circuit disposed on the chip, wherein the rows of I/O circuits are disposed outside the core circuit and at the periphery of the chip.

BRIEF DESCRIPTION OF THE DRAWINGS

The present invention can be more fully understood by reading the subsequent detailed description and examples with reference made to the accompanying drawings, wherein.

DETAILED DESCRIPTION OF THE INVENTION

Figure 1:
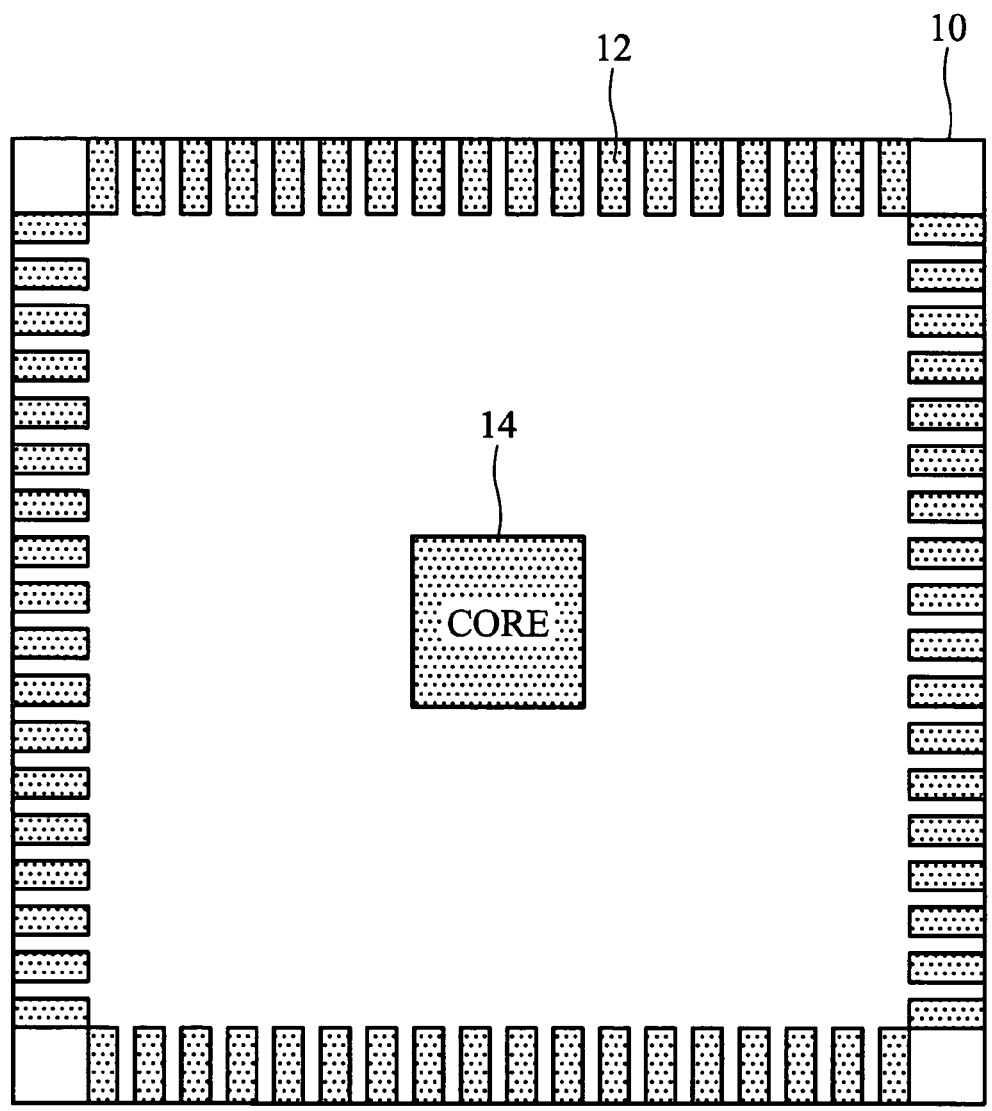
FIG. 1 shows I/O circuit placement in a conventional semiconductor chip.
Figure 2:
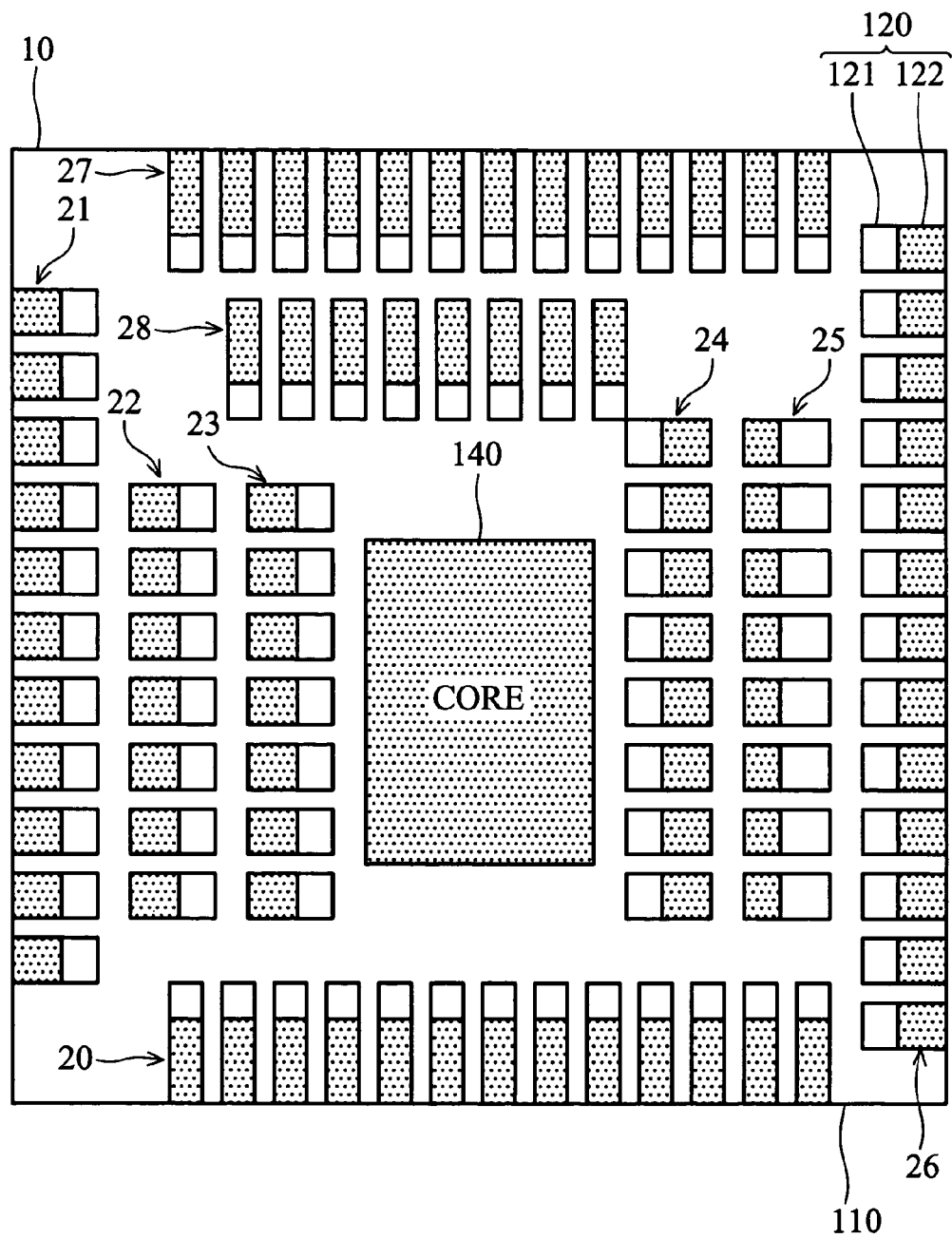
FIG. 2 shows I/O circuit placement in a semiconductor according to the present invention.

FIG. 2 shows one example of the layout of the semiconductor device according to the present invention. The semiconductor device includes a semiconductor chip 110 composed of silicon or the like, which includes a core circuit region 140 and a plurality of I/O circuits 120.

In the core circuit region 140, for example, basic cells are arranged in an array such as a gate array. As those basic cells are interconnected via an interconnection layer, an operational circuit with a given function is constructed.

As shown in FIG. 2, the I/O circuits 120 are provided in the outer periphery of the core circuit region 140. In this case, the I/O circuits 120 are arranged in a plurality of rows. Three rows (21, 22 and 23) of I/O circuits are disposed at the left side of the semiconductor chip 100. A row 20 of I/O circuits is disposed on the bottom side of the semiconductor chip 110. Three rows, 24, 25, and 26 of I/O circuits are disposed at the right side of the semiconductor chip 100. Two rows, 27, and 28 of I/O circuits are disposed on the upper side of the semiconductor chip 100. In this case, the rows, 20, 21, 26, and 27 of I/O circuits can form a loop.

In the present invention, each I/O circuit 120 has a head section 121 and a tail section 122. In the row 21, for example, the I/O circuits 120 are arranged in the vertical direction, and the head section 121 and tail section 122 of each I/O cell 120 is arranged in the horizontal direction. Additionally, in row 20, the I/O circuits 120 are arranged in the horizontal direction and the head section 121 and tail section 122 of each I/O cell 120 is arranged in the horizontal direction. Thus, in the present invention, the placement direction of the head section 121 and the tail section 122 in each I/O circuit 120 is perpendicular to placement direction of the I/O circuits in the rows (20~28).

The tail section 122, for example, can be an input driver, an output driver or an input/output driver to transfer signals to and from the given external device. The head regions 121, each has level shifter circuit to convert signal levels, as interface circuits between the tail section 122 and the basic cells formed in the core circuit region 140. In the case of an external circuit operating at a signal level in the 5V range and the core circuit region 140 operates on a signal level in the 3V range, the head section 121 converts the 5V range signal level from the external circuit to a 3V range signal level or converts the 3V range signal level from the core circuit region 140 to a 5V range signal level.

Moreover, in the present invention, the head sections 121 in the I/O cells 120 can be oriented to the head sections or tail sections 122 in the adjacent rows based on the circuit design. As shown in FIG. 2, for example, the tail sections 122 in the row 22 of I/O circuits are oriented to head sections 121 in the row 21 of I/O circuits, and the tail sections 122 in the row 23 of I/O circuits are oriented to head sections 121 in the row 22. Additionally, the tail sections 122 in the row 24 of I/O circuits are oriented to the tail sections 122 in the row 25 of I/O circuits, and the head sections 121 in the row 25 of I/O circuits are oriented to head sections 121 in the row 26.

As shown in FIG. 2, thirteen I/O circuits are arranged in the rows 20, 26 and 27 respectively, and eight I/O circuits are arranged in the rows 24, 25 and 28 respectively. Seven I/O circuits are arranged in the rows 22 and 23 respectively, and eleven I/O circuits are arranged in the row 21. In the present invention, the number of I/O circuits placed in different rows can be different according to circuit design. Moreover, the present invention is also applicable to Redistributed Layers (RDL) in flip-chip packages.

As shown in FIG. 2, in I/O circuit placement of the present invention, the I/O circuits are arranged in two rows or more at one side of the chip, thus the present invention reduces the space wasted by the pad limit design, and thereby reduces cost.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An I/O circuit placement method for placing I/O circuits included in a semiconductor device, comprising a step of:
    placing at least two rows of I/O circuits on a first side of a chip, wherein each I/O circuit has a head section and a tail section, the head section and the tail section are arranged in a column direction perpendicular to a row direction of the I/O circuits, wherein the head sections in one of the at least two rows are oriented to the tail sections in an adjacent rows, the tail section transfer signals to and from external devices and each of the head sections serves as an interface circuit between each of the tail section and a core circuit region to convert signal level of each of the signals.

2. The placement method as claimed in claim 1 further comprises a step of placing another row of I/O circuits on a second side of the chip.

3. The placement method as claimed in claim 1, wherein a different number of I/O circuits are placed in different rows.

4. A semiconductor device, comprising:
    a chip; and
    at least two rows of I/O circuits placed on a first side of the chip, wherein each I/O circuit has a head section and a tail section, the head section and the tail section are arranged in a column direction perpendicular to a row direction of the I/O circuits, wherein the head sections in one of the at least two rows are oriented to the tail sections in an adjacent rows, the tail section transfer signals to and from external devices and each of the head sections serves as an interface circuit between each of the tail section and a core circuit region to convert signal level of each of the signals.

5. The semiconductor device as claimed in claim 4, further comprising another row of I/O circuits placed on a second side of the chip.

6. The semiconductor device as claimed in claim 4, wherein the core circuit region is disposed on the chip, and the rows of I/O circuits are disposed outside the core circuit region and are at the periphery of the chip.

7. The semiconductor device as claimed in claim 4, wherein the number of the I/O circuits placed in the different rows is different.

8. A semiconductor device, comprising:
    a chip;
    a core circuit region disposed on the chip;
    a loop of I/O circuits disposed at the periphery of the chip and around the core circuit region; and
    at least one row of I/O circuits disposed between the loop of I/O circuits and the core circuit region, wherein each I/O circuit has a head section and a tail section, and the head sections of the row are oriented to the tail sections in an adjacent row wherein the tail sections transfer signals to and from external devices and each of the head section serves as an interface circuit between each of the tail section and a core circuit region to convert signal level of each of the signals.

* * * * *